US006963509B1

(12) United States Patent  (10) Patent No.: US 6,963,509 B1
Ju  (45) Date of Patent: Nov. 8, 2005

(54) PAGE BUFFER HAVING DUAL REGISTER, SEMICONDUCTOR MEMORY DEVICE HAVING THE SAME, AND PROGRAM METHOD THEREOF

(75) Inventor: Gi Seok Ju, Kyungki-Do (KR)

(73) Assignee: Hynix Semiconductor Inc., Kyungki-Do (KR)

(*) Notice: Subject to any disclaimer, the term of this patent is extended or adjusted under 35 U.S.C. 154(b) by 0 days.

(21) Appl. No.: 10/879,857

(22) Filed: Jun. 29, 2004

(30) Foreign Application Priority Data

Apr. 20, 2004 (KR) ................... 10-2004-0027107

(51) Int. Cl.[7] ................................. G11C 7/00

(52) U.S. Cl. .................. 365/189.05; 365/189.12; 365/154

(58) Field of Search ............... 365/189.05, 189.12, 365/154

(56) References Cited

U.S. PATENT DOCUMENTS 6,671,204 B2 * 12/2003 Im ..................... 365/185.12
2003/0117856 A1 * 6/2003 Lee et al. ............ 365/189.05

* cited by examiner

Primary Examiner—Richard Elms
Assistant Examiner—N. Nguyen
(74) Attorney, Agent, or Firm—Marshall, Gerstein & Borun LLP

(57) ABSTRACT

The present invention discloses a page buffer having a dual register, a semiconductor memory device having the same, and a program method thereof. A data transmission path is formed by installing switching units so that a main register as well as a cache register can be directly provided with a data. Therefore, a program operation is performed directly by using the main register in a normal program operation, and by using the cache register in a cache program operation. Accordingly, a process for transmitting the data from the cache register to the main register is omitted in the normal program operation, to reduce a transmission time (about 3 μs). As a result, the program time can be reduced in the whole program operation. Because the process for transmitting the data from the cache register to the main register is omitted in the normal program operation, the circuit control operation can be simplified.

9 Claims, 4 Drawing Sheets

PAGE BUFFER HAVING DUAL REGISTER, SEMICONDUCTOR MEMORY DEVICE HAVING THE SAME, AND PROGRAM METHOD THEREOF

BACKGROUND

1. Field of the Invention

The present invention relates to a page buffer having a dual register, a semiconductor memory device having the same, and a program method thereof, and more particularly to, a page buffer having a dual register which can reduce a whole program time by reducing a program time in a normal program operation, a semiconductor memory device having the same, and a program method thereof.

2. Discussion of Related Art

Recently, there are increasing demands for a semiconductor memory device which has electrical program and erase functions and which does not need a refresh function of re-producing a data at intervals of a predetermined period. In addition, researches have been actively made on a high integration technology of a memory device to develop a large capacity memory device for storing a lot of data. Here, a program operation means an operation of writing a data on a memory cell, and an erase operation means an operation of erasing the data written on the memory cell.

A NAND type flash memory device in which a plurality of memory cells are connected in series to form one string (namely, adjacent cells share a drain or source) has been developed for high integration of the memory device. Differently from a NOR type flash memory device, the NAND type flash memory device sequentially reads information. The program and erase operations of the NAND type flash memory device are performed by controlling a threshold voltage of the memory cell, by implanting or emitting electrons to/from a floating gate according to an F-N tunneling method.

The NAND type flash memory device uses a page buffer for storing a large capacity of information in a short time. The page buffer receives a large capacity of data from an input/output pad, and transmits the data to the memory cells. The page buffer is generally comprised of a single register to temporarily store data, but recently comprised of a dual register to increase a program speed in the program operation of a large capacity of data in the NAND type flash memory device.

FIG. 1 is a circuit diagram illustrating a conventional page buffer having a dual register. In FIG. 1, P1 to P4 denote PMOS transistors, N1 to N18 denote NMOS transistors, and HN1 to HN4 denote high voltage NMOS transistors.

Referring to FIG. 1, the conventional page buffer having the dual register performs a program operation on a memory cell of a memory cell array 10 according to a data from an input/output pad. The conventional page buffer includes a cache register 40, and a main register 30 for receiving a data from the cache register 40, stores the data, and transmits the data to the memory cell array 10 according to the operation of a bit line selecting unit 20.

The operational characteristics of the conventional page buffer in the program operation will now be explained with reference to FIG. 1. In the program operation, an YA pad YA maintains a ground state. When data 1 is inputted from the input/output pad, a control signal DI1 which is a data-in signal is enabled to, turn on NMOS transistors N12 and N13. Accordingly, an input terminal QAb of a latch unit 42 of the cache register 40 is transited to a low level. Conversely, when data 0 is inputted from the input/output pad, a control signal nD1 which is a data-in signal is enabled to turn on an NMOS transistor N15. Therefore, an output terminal QA of the latch unit 42 of the cache register 40 is transited to a low level. That is, according to the data from the input/output pad, a data having a predetermined value is stored in the latch unit 42 of the cache register 40, transmitted to the main register 30 through an NMOS transistor N14 turned on by a control signal PDUMP via a node SN, and stored in a latch unit 32. The data stored in the latch unit 32 of the main register 30 is transmitted to the plurality of memory cells of the memory cell array 10 through the bit line selecting unit 20, thereby performing the program operation.

However, the conventional page buffer of FIG. 1 executes the above procedure both in the cache program operation and the normal program operation. Normally, the program operation is divided into the normal program operation, and the cache program operation for storing a data in the cache register 40 in advance and performing the program operation to increase the program speed. Here, the normal program operation means a program operation of programming data at a time, and the cache program operation means a program operation of consecutively programming data a few times. In general, in the normal program operation, a program operation command signal, an address signal, a data and a normal program command signal 10h for indicating the normal program operation are inputted to the input/output pad. On the other hand, in the cache program operation, a program operation command signal, an address signal, a data and a cache program command signal 15h for indicating the cache program operation are inputted. That is, the normal program operation and the cache program operation are distinguished by the normal program command signal and the cache program command signal.

As described above, in the conventional page buffer, the data is transmitted to the main register 30 through the cache register 40, and transmitted to the memory cell array 10 both in the normal program operation and the cache program operation. That is, the process for transmitting the data from the cache register 40 to the main register 30 is performed in the whole program operations (including the normal program operation and the cache program operation). It takes about 3 μs to transmit the data from the cache register 40 to the main register 30. The program speed increases in the cache program operation using the cache register 40 for programming a large capacity of data. However, a time for transmitting the data from the cache register 40 to the main register 30 is unnecessarily spent in the normal program operation.

SUMMARY OF THE INVENTION

The present invention is directed to a page buffer having a dual register which can reduce a whole program time by reducing a program time in a normal program operation, a semiconductor memory device having the same, and a program method thereof.

One aspect of the present invention is to provide a page buffer for performing a data program operation on a memory cell by using a first register and a second register in the data program operation including a first program operation and a second program operation, wherein first and second switching units are installed to have one data transmission path respectively in the first register side and the second register side, and operated respectively according to first and second control signals enabled by first and second data inputted through an input/output pad, wherein, in the first program operation, the data program operation is performed on the memory cell through the first register by opening the first switching unit, and in the second program operation, the data program operation is performed on the memory cell through the second register by closing the second switching unit.

According to another aspect of the present invention, a semiconductor memory device includes: a memory cell array having a plurality of memory cells; and a page buffer coupled to the memory cell array, for performing a data program operation on the memory cells according to first and second data inputted through an input/output pad in the program operation.

According to yet another aspect of the present invention, a program method of a semiconductor memory device includes the steps of: deciding whether a current program operation is a first program operation or a second program operation; transmitting a first data to a YA pad; and when the current program operation is the first program operation, transmitting the first data inputted to the YA pad to a memory cell through a first register, and storing the first data in the memory cell, and when the current program operation is the second program operation, transmitting the first data inputted to the YA pad to the memory cell through the second register and the first register, and storing the first data in the memory cell.

DETAILED DESCRIPTION OF PREFERRED EMBODIMENTS

Figure 1:
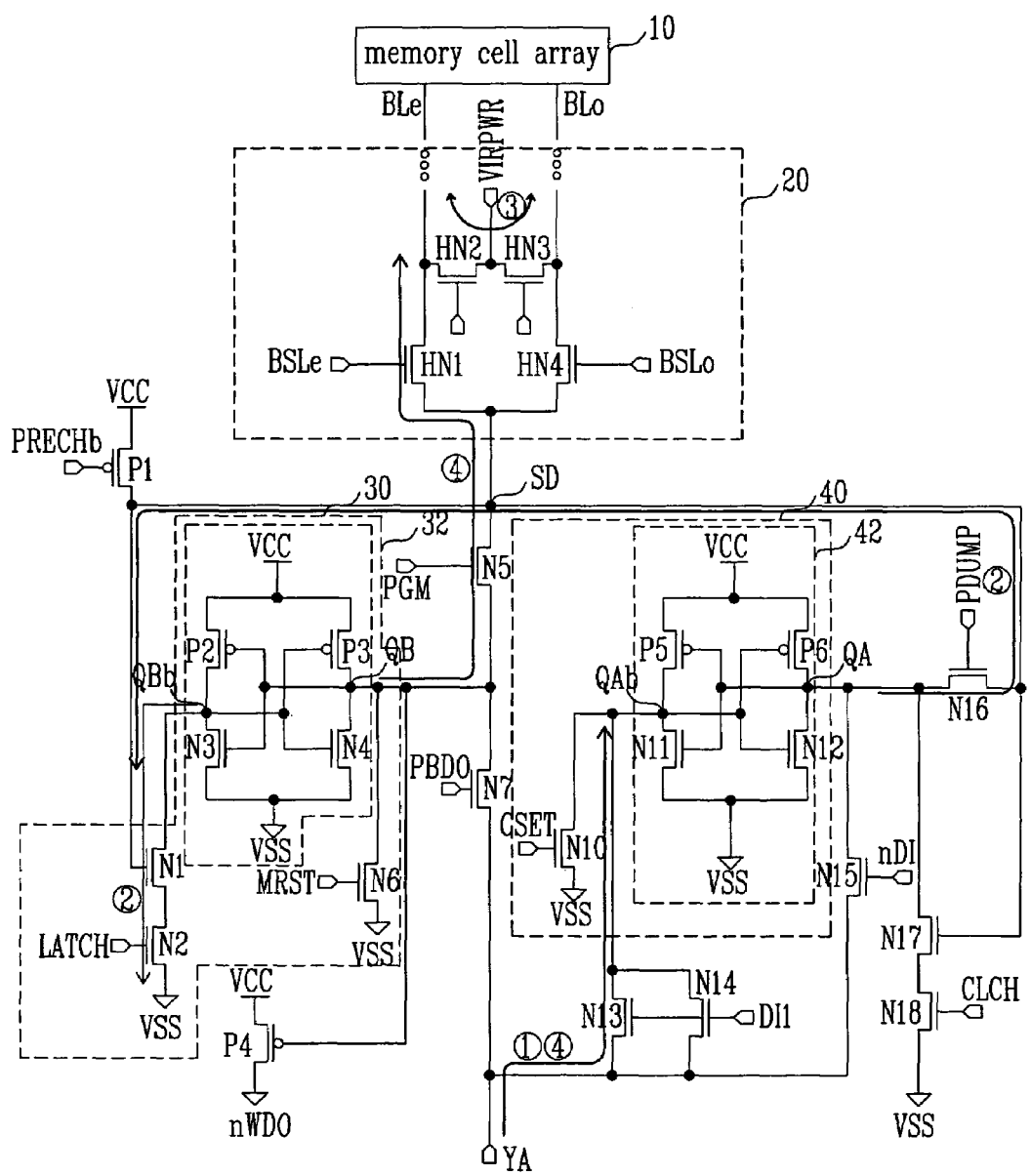
FIG. 1 is a circuit diagram illustrating a conventional page buffer having a dual register.

A page buffer having a dual register, a semiconductor memory device having the same, and a program method thereof in accordance with a preferred embodiment of the present invention will now be described in detail with reference to the accompanying drawings. Wherever possible, the same reference numerals will be used throughout the drawings and the description to refer to the same or like parts.

Figure 2:
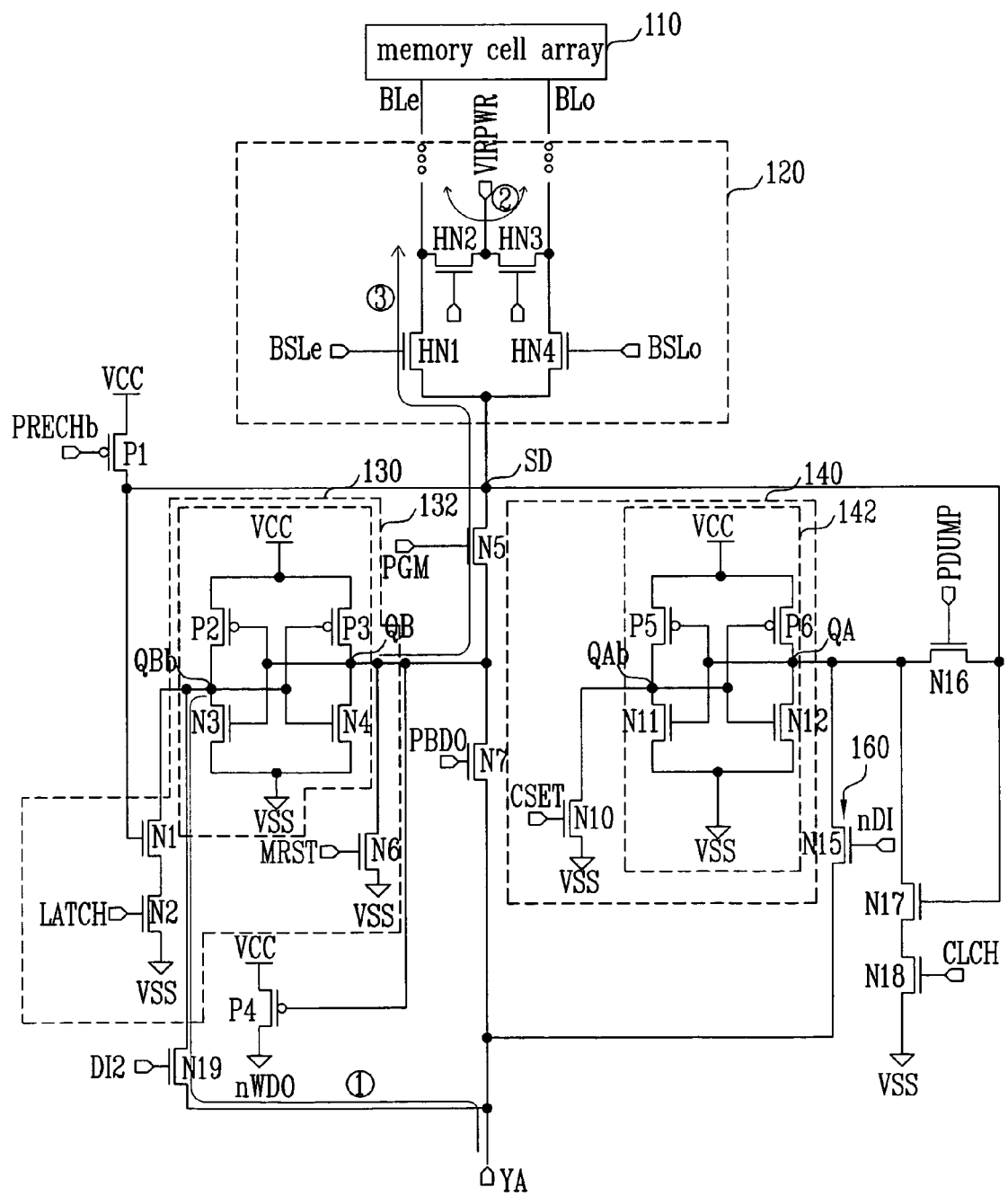
FIGS. 2 and 3 are circuit diagrams illustrating a page buffer having a dual register in accordance with a preferred embodiment of the present invention.
Figure 3:
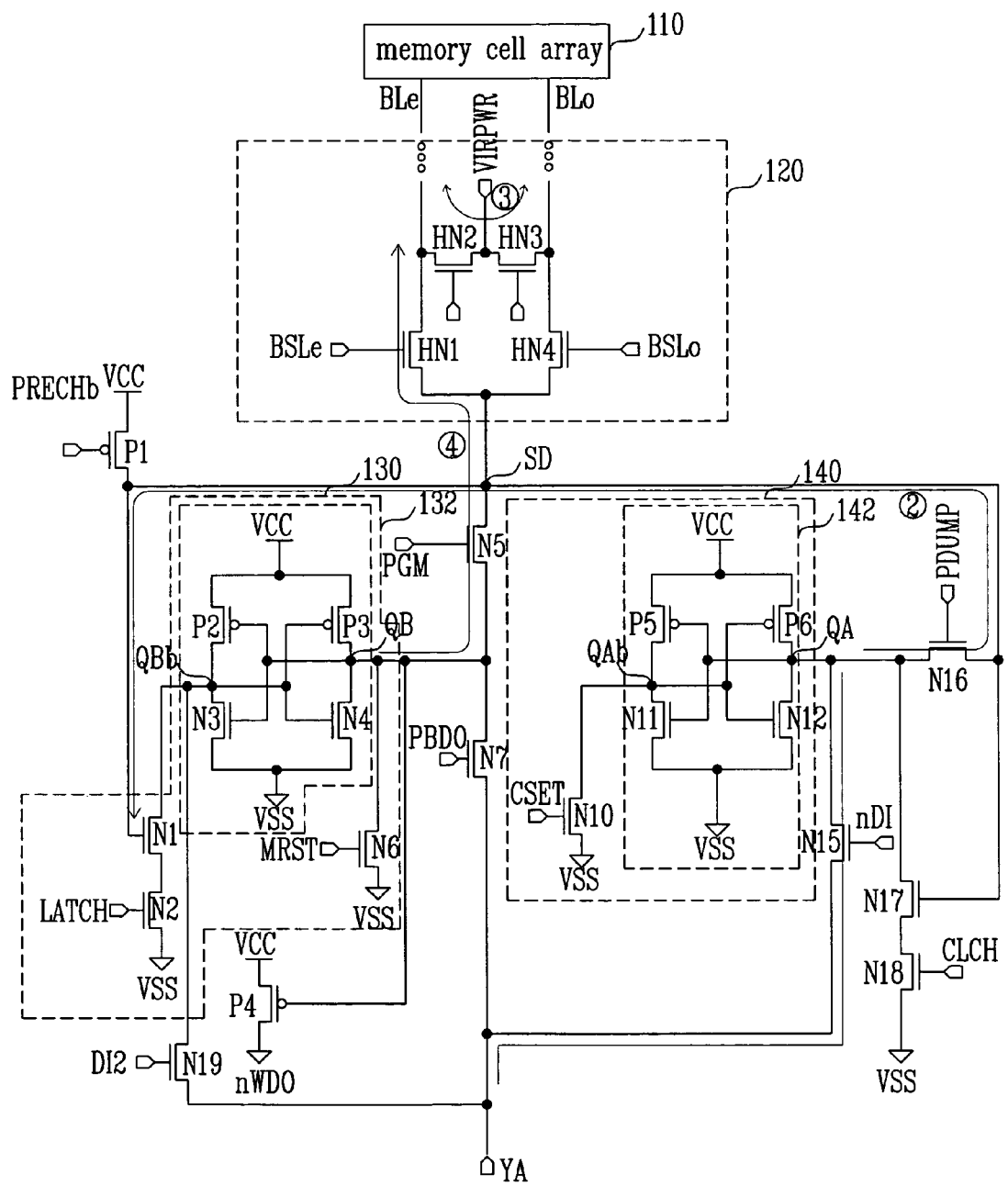

FIGS. 2 and 3 are circuit diagrams illustrating the page buffer having the dual register in accordance with the preferred embodiment of the present invention.

As illustrated in FIGS. 2 and 3, the page buffer having the dual register includes a main register 130 and a cache register 140 electrically coupled to a YA pad YA according to operations of switching units 150 and 160. In a program operation, the YA pad YA maintains a ground state. Here, each of the switching units 150 and 160 is operated according to control signals DI2 and nDI individually enabled by an input data in a data-in state, namely, when data 0 or 1 is inputted from an input/output pad (not shown).

The switching unit 150 (hereinafter, referred to as 'first switching unit') includes an NMOS transistor N19 turned on by the control signal DI2. The first switching unit 150 is coupled between an input terminal QBb of a latch unit 132 and the YA pad YA, and operated according to the control signal DI2 enabled when a data (first data) which will not be programmed is inputted through the input/output pad in a normal program operation, for electrically connecting the YA pad YA to the input terminal QBb of the latch unit 132. Here, the first data is a data which will not be programmed, generally '1'. The first data is inputted through the I/O pad.

The switching unit 160 (hereinafter, referred to as 'second switching unit') includes an NMOS transistor N15 turned on by the control signal nDI. The second switching unit 160 is coupled between an output terminal QA of a latch unit 142 of the cache register 140 and the YA pad YA, and operated according to the control signal nDI enabled when a data (second data) which will be programmed is inputted in a cache program operation, for electrically connecting the YA pad YA to the output terminal QA of the latch unit 142. Here, the second data is a data which will be programmed, generally '0'. The second data is also inputted through the input/output pad.

Figure 4:
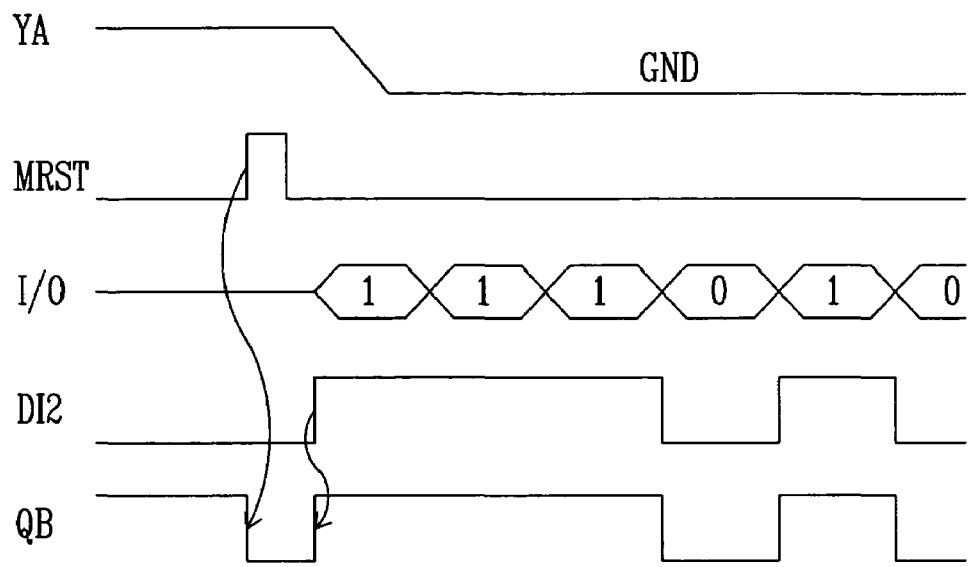
FIGS. 4 and 5 are waveform diagrams showing operational characteristics of the page buffer having the dual register of FIGS. 2 and 3.

The operational characteristics of the page buffer having the dual register in accordance with the preferred embodiment of the present invention will now be explained in the normal program operation and the cache program operation, respectively. FIG. 4 is a waveform diagram showing the normal program operation, and FIG. 5 is a waveform diagram showing the cache program operation.

As shown in FIGS. 2 and 4, in the normal program operation, an NMOS transistor N6 is turned on by a control signal MRST which is a main register reset signal, and thus an output terminal QB of the latch unit 132 is transited to a low level. To perform the program operation, the YA pad YA maintains a ground state GND. When the first data 1 is inputted to the input/output pad I/O, the control signal DI2 which is the data-in signal is enabled to turn on the NMOS transistor N19. Accordingly, the input terminal QBb of the latch unit 132 of the main register 130 and the YA pad YA are electrically connected, and thus a low level data is transmitted to the input terminal QBb of the latch unit 132. The output terminal QB of the latch unit 132 is transited to a high level. As a result, the program operation is not performed on the first data 1. On the other hand, when the second data 0 is inputted to the input/output pad I/O, the control signal DI2 is disabled to turn off the NMOS transistor N19.

Figure 5:
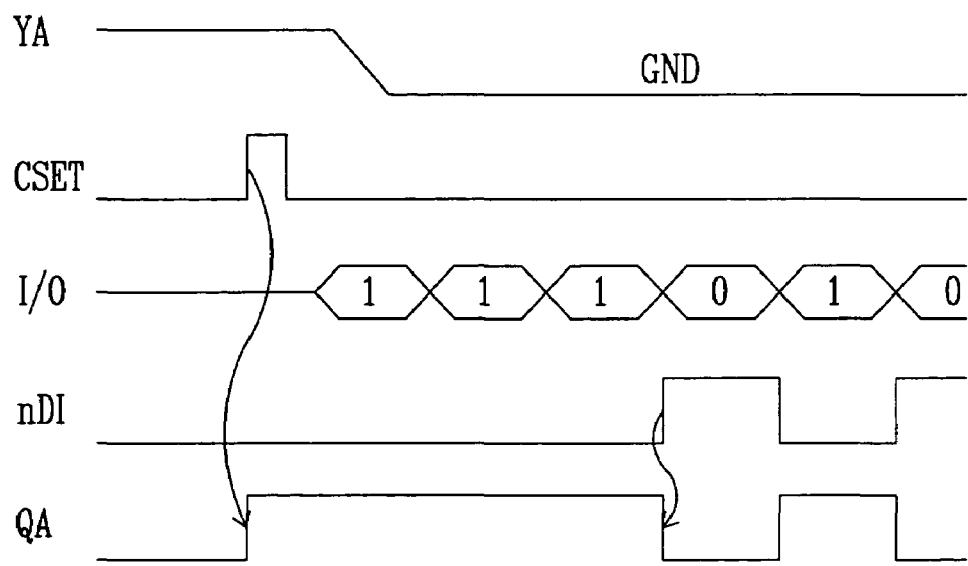

As depicted in FIGS. 3 and 5, in the cache program operation, an NMOS transistor N11 is turned on by a control signal CSET which is a cache register set signal, and thus an output terminal QAb of the latch unit 142 is transited to a low level. To perform the program operation, the YA pad YA maintains the ground state GND. When the first data 1 is inputted to the input/output pad I/O, the control signal nDI which is the data-in signal is disabled to turn off the NMOS transistor N15. Accordingly, the output terminal QA of the latch unit 142 of the cache register 140 and the YA pad YA are electrically insulated (opened), and thus the output terminal QA of the latch unit 142 maintains a high level. When the control signal PDUMP is enabled to turn on an NMOS transistor N16, the high level data is transmitted to a gate of an NMOS transistor N1 through a node SN, to turn on the NMOS transistor N1. In this state, when a latch signal LATCH is enabled, an NMOS transistor N2 is turned on. Therefore, the input terminal QBb of the latch unit 132 is transited to a low level, and the output terminal QB thereof is transited to a high level. As a result, the program operation is not performed. On the other hand, when the second data 0 is inputted to the input/output pad I/O, the control signal nDI is enabled to turn on the NMOS transistor N15. The output terminal QA of the latch unit 142 is transited to a low level, and thus the data is transmitted to the memory cell array 10 through the bit line selecting unit 120 via the node SN, thereby performing the program operation.

As described above, the page buffer performs the program operation by using the first switching unit 150 in the normal program operation, and the second switching unit 160 in the cache program operation. In order to control the program operation, the first and second switching units 150 and 160 are controlled respectively according to the control signals DI2 and nDI enabled by the data 0 and 1 inputted to the I/O pad. In the normal program operation, the output terminal QB of the latch unit 132 maintains a low level by the control signal MRST before the operation of the first switching unit 150. Thus, the program operation is performed. In the same manner, in the cache program operation, the output terminal QA of the latch unit 142 maintains a high level by the control signal CSET before the operation of the second switching unit 160. Therefore, the program operation is not performed.

On the other hand, when the semiconductor memory device is implemented by using the page buffer in accordance with the preferred embodiment of the present invention, a program time can be reduced in the program operation. Here, the semiconductor memory device is a nonvolatile memory device, such as a NAND type flash memory device or a NOR type flash memory device. The structure of the semiconductor memory device is identical to that of the conventional one except for the page buffer, and thus detailed explanations thereof are omitted.

The program method of the semiconductor memory device having the page buffer in accordance with the preferred embodiment of the present invention will now be described in association with the page buffer.

First, whether a current program operation is the normal program operation or the cache program operation is decided. As mentioned above, the normal program operation and the cache program operation can be distinguished by a normal program command signal 10h and a cache program command signal 15h included in the data inputted through the input/output pad. That is, the normal program operation and the cache program operation can be decided by receiving the command signal 10h or 15h in a logic block (not shown) in every program operation.

Thereafter, the YA pad YA maintains the ground state, and a low level data is transmitted to the page buffer. When the current program operation is the normal program operation, the page buffer transmits the data from the YA pad YA to the main register 130 by controlling the first switching unit (refer to 150 of FIGS. 2 and 3). The main register 130 stores the data from the YA pad YA, transmits the data to the memory cell array 110 through the bit line selecting unit 120, and stores the data in the memory cell.

Conversely, when the current program operation is the cache program operation, the page buffer transmits the low level data from the YA pad YA to the cache register 140 by controlling the second switching unit (refer to 160 of FIGS. 2 and 3). The cache register 140 stores the data from the YA pad YA, and transmits the data to the main register 130 through the node SN. The main register 130 stores the data from the cache register 140, transmits the data to the memory cell array 110 through the bit line selecting unit 120, and stores the data in the memory cell.

As discussed earlier, in accordance with the present invention, the data transmission path is formed by installing the switching units so that the main register as well as the cache register can be directly provided with the data. Therefore, the program operation is performed directly by using the main register in the normal program operation, and by using the cache register in the cache program operation.

Accordingly, the process for transmitting the data from the cache register to the main register is omitted in the normal program operation, to reduce the transmission time (about 3 $\mu$s). As a result, the program time can be reduced in the whole program operation. Because the process for transmitting the data from the cache register to the main register is omitted in the normal program operation, the circuit control operation can be simplified.

In accordance with the present invention, in the cache program operation, the transmission path of the data from the YA pad is selectively controlled by controlling the operations of each switching unit according to the data 0 and 1 from the input/output pad. Therefore, the data inputted to the main register side and the cache register side can be selectively separated, thereby reducing the program time.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A page buffer for performing a data program operation on a memory cell by using a first register and a second register in the data program operation including a first program operation and a second program operation, wherein first and second switching units are installed to have an individual data transmission path respectively in the first register side and the second register side, and operated respectively according to first and second control signals enabled by first and second data inputted through an input/output pad, wherein, in the first program operation, the data program operation is performed on the memory cell through the first register by opening the first switching unit, and in the second program operation, the data program operation is performed on the memory cell through the second register by closing the second switching unit.

2. The page buffer of claim 1, wherein, in the second program operation, when the first data is inputted, the first switching unit is closed, and when the second data is inputted, the second switching unit is closed.

3. The page buffer of claim 1, wherein, in the first program operation, when the second data is inputted, the data program operation is performed on the memory cell by opening the first switching unit and grounding an output terminal of a latch unit of the first register, and when the first data is inputted, the data program operation is not performed on the memory cell by opening the first switching unit.

4. The page buffer of claim 1, wherein, in the second program operation, when the second data is inputted, the data program operation is performed on the memory cell by closing the second switching unit, and when the first data is inputted, the data program operation is not performed on the memory cell by opening the second switching unit and grounding an input terminal of a latch unit of the second register.

5. The page buffer of claim 1, wherein the first and second switching units comprise transistors, respectively.

6. A semiconductor memory device, comprising:
a memory cell array having a plurality of memory cells; and
a page buffer coupled to the memory cell array, for performing a data program operation on the memory cells according to first and second data inputted through an input/output pad in the program operation, wherein first and second switching units are installed to have an individual data transmission path respectively in the first register side and the second register side, and operated respectively according to first and second control signals enabled by first and second data inputted through an input/output pad, wherein, in the first program operation, the data program operation is performed on the memory cell through the first register by opening the first switching unit, and in the second program operation, the data program operation is performed on the memory cell through the second register by closing the second switching unit.

7. A program method of a semiconductor memory device, comprising the steps of:
(a) deciding whether a current program operation is a first program operation or a second program operation;
(b) transmitting a first data to a YA pad; and
(c) when the current program operation is the first program operation, transmitting the first data inputted to the YA pad to a memory cell through a first register, and storing the first data in the memory cell, and when the current program operation is the second program operation, transmitting the first data inputted to the YA pad to the memory cell through a data transmission path including the second register and the first register, and storing the first data in the memory cell.

8. The method of claim 7, comprising a step for transmitting the first data inputted to the YA pad to any one of the first and second registers according to second and third data inputted to an input/output pad, when the current program operation is the second program operation in step (c).

9. The method of claim 8, comprising a step for transmitting the first data from the YA pad to the first register by enabling the first switching unit when the second data is inputted, and transmitting the first data from the YA pad to the second register by enabling the second switching unit when the third data is inputted.

* * * * *